(12) United States Patent
Li et al.

(10) Patent No.: US 9,185,801 B2
(45) Date of Patent: Nov. 10, 2015

(54) HALOGEN-FREE RESIN COMPOSITION, COPPER CLAD LAMINATE USING THE SAME, AND PRINTED CIRCUIT BOARD USING THE SAME

(71) Applicant: ELITE ELECTRONIC MATERIAL (ZHONGSHAN) CO.,LTD, Guangdong Province (CN)

(72) Inventors: Chang-Yuan Li, Guangdong Province (CN); Li-Chih Yu, Tao-Yuan Hsien (TW); Hong-Xia Peng, Guangdong Province (CN)

(73) Assignee: ELITE ELECTRONIC MATERIAL (ZHONGSHAN) CO., LTD, Jiangsu Province (CN)

( * ) Notice: Subject to any disclaimer, the term of this patent is extended or adjusted under 35 U.S.C. 154(b) by 108 days.

(21) Appl. No.: 13/834,473

(22) Filed: Mar. 15, 2013

(65) Prior Publication Data

US 2014/0178697 A1 Jun. 26, 2014

(30) Foreign Application Priority Data

Dec. 25, 2012 (CN) .......................... 2012 1 0572175

(51) Int. Cl.
*B32B 27/38* (2006.01)
*H05K 1/03* (2006.01)
(52) U.S. Cl.
CPC ........ *H05K 1/0373* (2013.01); *H05K 2201/012* (2013.01); *H05K 2201/0209* (2013.01); *Y10T 428/31529* (2015.04)
(58) Field of Classification Search
None
See application file for complete search history.

(56) References Cited

U.S. PATENT DOCUMENTS

| 6,440,567 B1 | 8/2002 | Choate et al. | |
| 7,255,925 B2 | 8/2007 | Chung et al. | |
| 2002/0155298 A1* | 10/2002 | Hirai ....................... | B32B 15/08 428/416 |
| 2011/0253433 A1 | 10/2011 | Chen | |
| 2011/0278052 A1* | 11/2011 | Hsu ............................... | 174/258 |
| 2011/0303446 A1* | 12/2011 | Chen et al. .................... | 174/258 |

FOREIGN PATENT DOCUMENTS

| CN | 101415296 | * | 4/2009 |
| EP | 0763566 A1 | | 3/1997 |
| TW | 200817469 | | 4/2008 |

OTHER PUBLICATIONS

Guo et al., CN 10141529—machine translation. Apr. 22, 2009.*
Sigma-Aldrich: 4,4'-oxydianiline. Retrieved on Sep. 22, 2014.*
Glossary of UV/EB terms: Latent curing. Retrieved on Sep. 23, 2014.*
English Abstract for TW 200817469.

* cited by examiner

*Primary Examiner* — Coris Fung
(74) *Attorney, Agent, or Firm* — WPAT, P.C.; Anthony King

(57) ABSTRACT

A halogen-free resin composition includes (A) 100 parts by weight of epoxy resin; (B) 2 to 15 parts by weight of oxydianiline (ODA); and (C) 2 to 20 parts by weight of amino triazine novolac (ATN) resin. The halogen-free resin composition includes specific ingredients, and is characterized by specific proportions thereof, to thereby achieve a low dielectric constant, a low dielectric dissipation factor, high heat resistance, and high flame retardation, and thus is suitable for producing a prepreg or resin film to thereby be applicable to copper clad laminates and printed circuit boards.

10 Claims, No Drawings

HALOGEN-FREE RESIN COMPOSITION, COPPER CLAD LAMINATE USING THE SAME, AND PRINTED CIRCUIT BOARD USING THE SAME

CROSS-REFERENCE TO RELATED APPLICATION

This non-provisional application claims priority under 35 U.S.C. §119(a) on Patent Application No(s). 201210572175.0 filed in China on Dec. 25, 2012, the entire contents of which are hereby incorporated by reference.

FIELD OF THE INVENTION

The present invention relates to halogen-free resin compositions, and more particularly, to a halogen-free resin composition applicable to copper clad laminates and printed circuit boards.

BACKGROUND OF THE INVENTION

To get in line with the global trend of environmental protection, and eco-friendly regulations, electronic product manufacturers nowadays are developing, and manufacturing halogen-free electronic products. Advanced countries, and electronic manufacturing giants set forth schedules of launching mass production of halogen-free electronic products. As a result of the promulgation of the Restriction of Hazardous Substances (RoHS) by the European Union, hazardous substances, such as lead, cadmium, mercury, hexavalent chromium, poly-brominated biphenyl (PBB), and poly-brominated diphenyl ether (PBDE), are strictly prohibited from being used in manufacturing electronic products or their parts, and components. A printed circuit board (PCB) is an indispensable, and fundamental basis of the semiconductor industry, and electronic industry; hence, printed circuit boards bore the brunt of international halogen-free regulations when international organizations set forth strict requirements of the halogen content of printed circuit boards. For example, the International Electrotechnical Commission (IEC) 6 1249-2-21 requires that bromide content, and chloride content shall be less than 900 ppm, and the total halogen content shall be less than 1500 ppm. The Japan Electronics Packaging, and Circuits Association (JPCA) requires that both bromide content, and chloride content shall be less than 900 ppm. To enforce its green policies, Greenpeace calls on manufacturers worldwide to get rid of polyvinyl chloride (PVC), and brominated flame retardants (BFRs) from their electronic products in order to conform with the lead-free, and halogen-free requirements of green electronics. Hence, the industrial sector nowadays is interested in rendering related materials halogen-free, and sees this technique as one of its key research topics.

Electronic products nowadays have the trend toward compactness, and high-frequency transmission; hence, circuit boards nowadays typically feature a high-density layout, and increasingly strict material requirements. To mount high-frequency electronic components on a circuit board, it is necessary that the substrate of the circuit board is made of a material of a low dielectric constant (Dk), and dielectric dissipation factor (Df) in order to maintain the transmission speed, and the integrity of a signal transmitted. To allow the electronic components to operate well at a high temperature, and a high-humidity environment, it is necessary for the circuit board to be heat resistant, fire resistant, and of low hygroscopicity. Epoxy resin is adhesive, heat resistant, and malleable, and thus is widely applicable to encapsulants, and copper clad laminates (CCL) of electronic components, and machinery. From the perspective of fire prevention, and safety, any applicable material is required to be capable of flame retardation. In general, epoxy resin is incapable of flame retardation, and thus epoxy resin has to acquire flame retardation capability by including a flame retardant therein. For example, a halogen, especially bromine, is included in epoxy resin to bring about flame retardation capability of epoxy resin, and enhance the reactivity of the epoxy group. Furthermore, when exposed to a high temperature for a long period of time, a halogen compound is likely to decompose, and thereby erode a fine circuit. Furthermore, combustion of discarded used electronic parts, and components produces hazardous compounds, such as halogen compounds, which are environmentally unfriendly. To find an alternative to the aforesaid halogen compound-based flame retardant, researchers attempt to use a phosphorous compound as a flame retardant, for example, adding phosphate ester (U.S. Pat. No. 6,440,567) or red phosphorus (EP 0763566) to an epoxy resin composition. However, phosphate ester undergoes hydrolysis readily to produce an acid, thereby compromising its tolerance to migration. Although red phosphorus is good at flame retardation, it falls into the category of hazardous compounds under the firefighting law, because it produces a trace of a flammable, toxic gas known as phosphine in a warm humid environment.

A conventional circuit board manufacturing method, such as a conventional method of manufacturing a copper-clad substrate (also known as copper clad laminate, CCL), involves heating, and combining a reinforcement material (such as a glass fiber fabric), and a thermosetting resin composition made of an epoxy resin, and a curing agent to form a prepreg, and then laminating the prepreg, and the upper, and lower copper foils together at a high temperature, and a high pressure. The prior art usually teaches using a thermosetting resin composed of an epoxy resin, and a hydroxyl-containing phenol novolac resin curing agent. Due to the combination of the phenol novolac resin, and the epoxy resin, epoxide ring-opening reactions end up with another hydroxyl which not only increases the dielectric constant (Dk), and the dielectric dissipation factor inherently, but also reacts with water readily, and thereby renders the thermosetting resin more hygroscopic.

U.S. Pat. No. 7,255,925 discloses a thermosetting resin composition composed of cyanate ester resin, dicyclopentadiene (DCPD) epoxy resin, silica, and a thermoplastic resin. The thermosetting resin composition is characterized by a low dielectric constant (Dk), and a low dielectric dissipation factor. However, a method for manufacturing the thermosetting resin composition of U.S. Pat. No. 7,255,925 requires the use of a halogen-containing (such as bromine-containing) flame retardant, such as tetrabromocyclohexane, hexabromocyclodecane, or 2,4,6-tris(tribromophenoxy)-1,3,5-triazine. However, the bromine-containing flame retardant causes environmental pollution readily during the thermosetting resin composition manufacturing process, the using processing of thermosetting resin composition, and even after the thermosetting resin composition has been discarded or recycled. To ensure a high heat resistance, high flame retardation, low dielectric dissipation factor, low hygroscopicity, high cross-linking density, high glass transition temperature, high connectivity, and appropriate thermal expansion of copper clad laminates, an important factor lies in the selection of an epoxy resin, a curing agent, and a reinforcement material.

Taiwan Published Patent Application 200817469 discloses a thermosetting resin composition that comprises an epoxy resin, a flame retardant, and a curing agent. The curing agent comprises dicyandiamide (DICY) and a low-temperature catalyst. Optionally, the curing agent further comprises aromatic amines, such as diaminodiphenyl sulfone (DDS). However, the aforesaid thermosetting resin composition uses both DICY and DDS as curing agent, takes long time to react with the epoxy resin in order to undergo a curing process, does not cure readily, and renders the resultant laminate overly hygroscopic.

US Published Patent No. 2011/0253433 A1 discloses an epoxy resin composition that comprises: (A) an epoxy resin; (B) a composite curing agent comprising amino triazine novolac (ATN) resin and DDS which are mixed at a specific proportion; (C) a curing accelerator; and (D) an inorganic filler. The epoxy resin composition comprises the ATN resin and thus is more effective in controlling the time taken to react with the epoxy resin in the curing process and more effective in reducing the hygroscopicity of the resultant laminates. Nonetheless, it is necessary for improvement in the dielectric properties of the resultant laminates.

The major considerations given to electrical properties include the dielectric constant (Dk), and the dielectric dissipation factor (Df). In general, the signal transmission speed of a copper-clad substrate is inversely proportional to the square root of the dielectric constant (Dk) of the material from which the copper-clad substrate is made, and thus the minimization of the dielectric constant (Dk) of the substrate material is usually advantageously important. The lower the dielectric dissipation factor (Df) is, the lesser the signal transmission loss is; hence, a material of a low dielectric dissipation factor provides satisfactory transmission quality.

Accordingly, it is important for printed circuit board material suppliers to develop materials of a low dielectric constant (Dk), and a low dielectric dissipation factor (Df), and apply the materials to high-frequency printed circuit board manufacturing.

SUMMARY OF THE INVENTION

In view of the aforesaid drawbacks of the prior art, the inventor of the present invention conceived room for improvement in the prior art, and thus conducted extensive researches, and experiments according to the inventor's years of experience in the related industry, and finally developed a halogen-free resin composition as disclosed in the present invention to achieve a low dielectric constant (Dk), a low dissipation factor (Df), high heat resistance, and high flame retardation.

It is an objective of the present invention to provide a halogen-free resin composition comprising specific ingredients, and characterized by specific proportions thereof so as to achieve a low dielectric constant (Dk), a low dielectric dissipation factor (Df), high heat resistance, and high flame retardation. The halogen-free resin composition is suitable for producing a prepreg or a resin film, and thus applicable to copper clad laminates, and printed circuit boards.

In order to achieve the above and other objectives, the present invention provides a halogen-free resin composition comprising: (A) 100 parts by weight of epoxy resin; (B) 2 to 15 parts by weight of oxydianiline (ODA); and (C) 2 to 20 parts by weight of amino triazine novolac (ATN) resin.

As regards its purpose, the halogen-free resin composition is applicable to the manufacturing of a prepreg, a resin film, a copper clad laminate, and a printed circuit board. Therefore, the halogen-free resin composition of the present invention is characterized by specific ingredients which are of specific proportions, so as to achieve a low dielectric constant Dk, a low dissipation factor (Df), high heat resistance, and high flame retardation. Therefore, the halogen-free resin composition of the present invention is effective in manufacturing a prepreg or a resin film and thereby applicable to copper clad laminates and printed circuit boards.

As regards the halogen-free resin composition of the present invention, the ingredient (A) epoxy resin is one, or a combination, of: bisphenol A epoxy resin, bisphenol F epoxy resin, bisphenol S epoxy resin, bisphenol AD epoxy resin, phenol novolac epoxy resin, bisphenol A novolac epoxy resin, bisphenol F novolac epoxy resin, o-cresol novolac epoxy resin, trifunctional epoxy resin, tetrafunctional epoxy resin, multifunctional epoxy resin, dicyclopentadiene (DCPD) epoxy resin, phosphorus-containing epoxy resin, DOPO epoxy resin, DOPO-HQ epoxy resin, p-xylene epoxy resin, naphthalene epoxy resin, benzopyran epoxy resin, biphenyl novolac epoxy resin, isocyanate modified epoxy resin, phenol benzaldehyde epoxy resin, and phenol aralkyl novolac epoxy resin. DOPO epoxy resin includes DOPO-PN epoxy resin, DOPO-CNE epoxy resin, and DOPO-BPN epoxy resin. DOPO-HQ epoxy resin includes DOPO-HQ-PN epoxy resin, DOPO-HQ-CNE epoxy resin, and DOPO-HQ-BPN epoxy resin.

The present invention achieves lower dielectric properties than the prior art does, because oxydianiline (ODA) achieves lower dielectric properties than diaminodiphenyl sulfone (DDS) does, though both oxydianiline (ODA) and diaminodiphenyl sulfone (DDS) are diamine curing agent.

As regards the halogen-free resin composition of the present invention, the ingredient (B) oxydianiline (ODA) is preferably 4,4'-oxydialiline (4,4'-ODA) commercially available at SEIKA Corporation.

As regards the halogen-free resin composition of the present invention, given 100 parts by weight of epoxy resin, 2 to 15 parts by weight of oxydianiline (ODA) is added thereto, wherein the content of the oxydianiline (ODA) thus added allows laminates produced from the halogen-free resin composition to exhibit high heat resistance, enhanced pull given to copper foils, a low dielectric constant, and a low dielectric dissipation factor (the lower the dielectric constant and dielectric dissipation factor are, the better is the performance of the laminates produced from the halogen-free resin composition of the present invention.) If less than 2 parts by weight of oxydianiline (ODA) is added, the laminates produced from the halogen-free resin composition will not exhibit high heat resistance, enhanced pull given to copper foils, a low dielectric constant and a low dielectric dissipation factor. If more than 15 parts by weight of oxydianiline (ODA) is added, the laminates will exhibit reduced heat resistance.

As regards the halogen-free resin composition of the present invention, the ingredient (C) amino triazine novolac (ATN) resin enhances flame retardation of the halogen-free resin composition of the present invention, is commercially available with brand names, such as LA-7052, LA-7054, LA-7751, and is manufactured by D. I. C.

As regards the halogen-free resin composition of the present invention, given 100 parts by weight of epoxy resin, 2 to 20 parts by weight of amino triazine novolac (ATN) resin is added thereto, wherein the content of the amino triazine novolac (ATN) resin thus added allows the laminates produced from the resin composition to achieve satisfactory flame retardation. If less than 2 parts by weight of amino triazine novolac (ATN) resin is added, the resin composition takes too long to cure. If more than 20 parts by weight of amino triazine novolac (ATN) resin is added, the heat resistance of the laminates produced from the resin composition is low.

The halogen-free resin composition of the present invention further comprises dicyandiamide (DICY) which is commercially available at Kingyorker Enterprise Co. Ltd. The dicyandiamide (DICY) is of a content of 0.01 to 3 parts by weight.

The halogen-free resin composition of the present invention further comprises a halogen-free flame retardant. The halogen-free flame retardant is a nitrogen-containing flame retardant or a phosphorus-containing flame retardant. A compound added to the halogen-free flame retardant includes, but is not limited to, at least one of the following: bisphenol diphenyl phosphate, ammonium poly phosphate, hydroquinone bis-(diphenyl phosphate), bisphenol A bis-(diphenylphosphate), tri(2-carboxyethyl)phosphine (TCEP), tris(chloroisopropyl)phosphate, trimethyl phosphate (TMP), dimethyl methyl phosphonate (DMMP), resorcinol dixylenylphosphate (RDXP, such as PX-200), phosphazene (such as SPB-100), m-phenylene methylphosphonate (PMP), melamine polyphosphate, melamine cyanurate, and tri-hydroxy ethyl isocyanurate. Furthermore, the halogen-free flame retardant can also be 9,10-dihydro-9-oxa-10-phosphaphenanthrene-10-oxide (DOPO), DOPO-containing phenol resin (such as DOPO-HQ, DOPO-PN, or DOPO-BPN), DOPO-containing epoxy resin, and/or DOPO-HQ epoxy resin, wherein DOPO-BPN is a bisphenol novolac compound, such as DOPO-BPAN, DOPO-BPFN, or DOPO-BPSN.

As regards the halogen-free resin composition of the present invention, given 100 parts by weight of epoxy resin, 10 to 100 parts by weight of halogen-free flame retardant is added thereto, wherein the content of the halogen-free flame retardant thus added allows the halogen-free resin composition to effectuate flame retardation. If less than 10 parts by weight of halogen-free flame retardant is added, flame retardation will not be achieved. If more than 100 parts by weight of halogen-free flame retardant is added, the laminates will exhibit high hygroscopicity and deteriorated heat resistance.

The halogen-free resin composition of the present invention further comprises an inorganic filler, a curing accelerator, a silane coupling agent, a toughening agent, a solvent, or a combination thereof.

As regards the halogen-free resin composition of the present invention, an inorganic filler thus added thereto increases the thermal conductivity of the resin composition and enhances its thermal expansion and mechanical strength. Preferably, the inorganic filler is uniformly distributed in the resin composition. The inorganic filler comprises silicon dioxide (existing in a fused state or a non-fused state, or featuring a porous structure or a hollow-core structure), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcinated talcum, talcum, silicon nitride, and/or calcinated china clay. The inorganic filler comes in the form of a spherical shape, a fiber-like shape, board-like shape, particulate shape, strip-like shape, or needle-like shape, and is selectively pre-treated with a silane coupling agent. The inorganic filler can be in the form of particulate powder of a diameter of less than 100 µm, or preferably a diameter of 1 µm to 20 µm, or most preferably a diameter of less than 1 µm, i.e., nanoscale particulate powder. The needle-shaped inorganic filler consists of particles each having a diameter of less than 50 µm and a length of 1 to 200 µm.

As regards the halogen-free resin composition of the present invention, given 100 parts by weight of epoxy resin, 10 to 1000 parts by weight of the inorganic filler is added thereto. If less than 10 parts by weight of the inorganic filler is added, the halogen-free resin composition will not manifest significant capability of heat conduction, enhanced thermal expansion, or enhanced mechanical strength. If more than 1000 parts by weight of the inorganic filler is added, the halogen-free resin composition will manifest deteriorated pore-filling mobility and deteriorated adhesion of copper foil.

The curing accelerator of the present invention comprise a catalysts, such as a Lewis base or a Lewis acid. The Lewis base includes imidazole, boron trifluoride amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP), and/or 4-dimethylaminopyridine (DMAP). The Lewis acid comprises a metal salt compound, such as a manganese, iron, cobalt, nickel, copper, or zinc metal salt compound, for example, a metal catalyst, such as zinc caprylate, or cobalt caprylate.

The silane coupling agent of the present invention comprises silane and siloxane, and, when categorized according to a functional group, includes amino silane (AS), amino siloxane, epoxy silane, and epoxy siloxane.

The toughening agent of the present invention comprises an additive selected from the group consisting of rubber resin, carboxyl-terminated butadiene acrylonitrile (CTBN) rubber, and core-shell rubber.

The solvent of the present invention comprises one selected from the group consisting of methanol, ethanol, ethylene glycol monomethyl ether, acetone, methyl ethyl ketone (MEK), methyl isobutyl ketone (MIBK), cyclohexanone, toluene, xylene, methoxyethyl acetate, ethoxyethyl acetate, propoxyethyl acetate, ethyl acetate, dimethylformamide, propylene glycol methyl ether, and a mixture thereof.

The halogen-free resin composition of the present invention further comprises one of phenol resin, phenol novolac resin, polyphenylene ether resin, cyanate ester resin, isocyanate ester resin, maleimide resin, polyester resin, styrene resin, butadiene resin, phenoxy resin, polyamide resin, and polyimide resin, or a combination thereof.

Yet another objective of the present invention is to provide a prepreg (PP). The prepreg has a low dielectric constant (Dk), a low dielectric dissipation factor (Df), high heat resistance, high flame retardation, low hygroscopicity, and halogen-free characteristics. Accordingly, the prepreg of the present invention comprises a reinforcement material and the aforesaid halogen-free resin composition, wherein the halogen-free resin composition is attached to the reinforcement material by means of impregnation, and heated up at a high temperature to be semi-cured. The reinforcement material, which is a fibrous material, a woven fabric, or a non-woven fabric, such as a glass fiber fabric, enhances the mechanical strength of the prepreg. Furthermore, the reinforcement material is selectively pretreated with a silane coupling agent or a silane coupling agent in order. For example, the reinforcement material is a glass fiber fabric pretreated with a silane coupling agent.

The aforesaid prepreg is heated up at a high temperature or heated at a high temperature and a high pressure to be cured and become a prepreg or a solid-state insulating layer. If the halogen-free resin composition comprises a solvent, the solvent vaporizes during a high-temperature heating process and vanishes.

A further objective of the present invention is to provide a copper clad laminate. The copper clad laminate has a low dielectric characteristic, high heat resistance, high flame retardation, low hygroscopicity, and halogen-free characteristics, and is especially applicable to a circuit board for use in high-speed and high-frequency signal transmission. Accordingly, the present invention provides a copper clad laminate that comprises two or more copper foils and at least an insulating layer. The copper foils are made of a metal alloy that contains copper and at least one of aluminum, nickel, platinum, silver, and gold. The insulating layer is formed by curing the aforesaid prepreg at a high temperature and a high pressure. For example, the aforesaid prepreg is sandwiched between the two copper foils, and then the two copper foils and the prepreg therebetween are laminated together at a high temperature and a high pressure.

The copper clad laminate of the present invention has at least one of the following advantages: a low dielectric constant (Dk) and a low dielectric dissipation factor (Df); excellent heat resistance and flame retardation; low hygroscopicity; high thermal conductivity; and being environmentally friendly by being halogen-free. The copper clad laminate is further processed by circuit-making process to become a circuit board. After electronic components have been mounted on the circuit board, the circuit board and the electronic components thereon can operate well in an adverse environment, such as a high temperature and a high humidity, without having their performance compromised.

A further objective of the present invention is to provide a printed circuit board. The printed circuit board has a low dielectric characteristic, high heat resistance, and high flame retardation, low hygroscopicity, and halogen-free characteristics, and is applicable to high-speed high-frequency signal transmission. The circuit board comprises at least one aforesaid copper clad laminate and is manufactured by a conventional process.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and changes made to the aforesaid embodiments should fall within the scope of the present invention, provided that they do not depart from the spirit of the present invention.

DETAILED DESCRIPTION OF THE PREFERRED EMBODIMENTS

Objectives, features, and advantages of the present invention are hereunder illustrated with specific embodiments as follows:

Embodiment 1 (E1)

A resin composition, comprising ingredients as follows:
(A) 100 parts by weight of epoxy resin (HP-7200HH);
(B) 9 parts by weight of 4,4'-oxydialiline (4,4'-ODA);
(C) 5 parts by weight of amino triazine novolac (ATN) resin (LA-7054);
(D) 35 parts by weight of inorganic filler (fused silica);
(E) 0.2 parts by weight of catalyst (2E4MI); and
(F) 25 parts by weight of solvent (MEK).

Embodiment 2 (E2)

A resin composition, comprising ingredients as follows:
(A) 100 parts by weight of epoxy resin (BE-188);
(B) 13 parts by weight of 4,4'-oxydialiline (4,4'-ODA);
(C) 5 parts by weight of amino triazine novolac (ATN) resin (LA-7054);
(D) 35 parts by weight of inorganic filler (fused silica);
(E) 0.15 parts by weight of catalyst (2E4MI); and
(F) 68 parts by weight of solvent (MEK).

Embodiment 3 (E3)

A resin composition, comprising ingredients as follows:
(A) 100 parts by weight of epoxy resin (HP-7200HH);
(B) 9 parts by weight of 4,4'-oxydialiline (4,4'-ODA);
(C) 5 parts by weight of amino triazine novolac (ATN) resin (LA-7054);
(D) 23 parts by weight of flame retardant (SPB-100);
(E) 41 parts by weight of inorganic filler (fused silica);
(F) 0.2 parts by weight of catalyst (2E4MI); and
(G) 40 parts by weight of solvent (MEK).

Embodiment 4 (E4)

A resin composition, comprising ingredients as follows:
(A) 100 parts by weight of epoxy resin (HP-7200HH);
(B) 8 parts by weight of 4,4'-oxydialiline (4,4'-ODA);
(C) 5 parts by weight of amino triazine novolac (ATN) resin (LA-7054);
(D) 0.5 parts by weight of dicyandiamide (DICY) (DICY);
(E) 23 parts by weight of flame retardant (SPB-100);
(F) 41 parts by weight of inorganic filler (fused silica);
(G) 0.2 parts by weight of catalyst (2E4MI); and
(H) 40 parts by weight of solvent (MEK).

Embodiment 5 (E5)

A resin composition, comprising ingredients as follows:
(A) 100 parts by weight of epoxy resin (HP-7200HH);
(B) 6 parts by weight of 4,4'-oxydialiline (4,4'-ODA);
(C) 20 parts by weight of amino triazine novolac (ATN) resin (LA-7054);
(D) 21 parts by weight of flame retardant (SPB-100);
(E) 44 parts by weight of inorganic filler (fused silica);
(F) 0.1 parts by weight of catalyst (2E4MI); and
(G) 35 parts by weight of solvent (MEK).

Comparison 1 (C1)

A resin composition, comprising ingredients as follows:
(A) 100 parts by weight of epoxy resin (HP-7200HH);
(B) 9 parts by weight of diaminodiphenyl sulfone (DDS);
(C) 5 parts by weight of amino triazine novolac (ATN) resin (LA-7054);
(D) 35 parts by weight of inorganic filler (fused silica);
(E) 0.2 parts by weight of catalyst (2E4MI); and
(F) 25 parts by weight of solvent (MEK).

Comparison 2 (C2)

A resin composition, comprising ingredients as follows:
(A) 100 parts by weight of epoxy resin (HP-7200HH);
(B) 8 parts by weight of diaminodiphenyl sulfone (DDS);
(C) 5 parts by weight of amino triazine novolac (ATN) resin (LA-7054);
(D) 0.5 parts by weight of dicyandiamide (DICY) (DICY);
(E) 23 parts by weight of flame retardant (SPB-100);
(F) 41 parts by weight of inorganic filler (fused silica);
(G) 0.2 parts by weight of catalyst (2E4MI); and
(H) 40 parts by weight of solvent (MEK).

Comparison 3 (C3)

A resin composition, comprising ingredients as follows:
(A) 100 parts by weight of epoxy resin (HP-7200HH);
(B) 16 parts by weight of 4,4'-oxydialiline (4,4'-ODA);
(C) 5 parts by weight of amino triazine novolac (ATN) resin (LA-7054);
(D) 24 parts by weight of flame retardant (SPB-100);
(E) 44 parts by weight of inorganic filler (fused silica);
(F) 0.3 parts by weight of catalyst (2E4MI); and
(G) 43 parts by weight of solvent (MEK).

Comparison 4 (C4)

A resin composition, comprising ingredients as follows:
 (A) 100 parts by weight of epoxy resin (HP-7200HH);
 (B) 9 parts by weight of 4,4'-oxydialiline (4,4'-ODA);
 (C) 25 parts by weight of amino triazine novolac (ATN) resin (LA-7054);
 (D) 22 parts by weight of flame retardant (SPB-100);
 (E) 47 parts by weight of inorganic filler (fused silica);
 (F) 0.1 parts by weight of catalyst (2E4MI); and
 (G) 38 parts by weight of solvent (MEK).

The resin compositions of embodiments 1-5 are shown in Table 1. The resin compositions of comparisons 1-4 are shown in Table 3.

The ingredients of the resin composition in embodiments 1-5 and comparisons 1-4 are evenly mixed in a blender batch by batch before being put into an impregnation tank. Then, a glass fiber fabric is passed through the impregnation tank to allow the resin composition to adhere to the glass fiber fabric before undergoing a heating and baking process to become semi-cured, thereby forming a prepreg.

A piece of 18-μm copper foil, four pieces of the prepreg prepared by the same batch, and another piece of 18-μm copper foil are stacked in sequence before being laminated against each other in vacuum at 200° C. for two hours to form a copper-clad laminate (CCL). The four pieces of prepreg are cured to form an insulating layer between the two copper foils.

A physical properties measurement process is performed on the non-copper-containing substrate of the etched aforesaid copper clad laminates and copper foils. The physical properties measurement process measures: perform a copper-containing laminate solder dip test (solder dip, 288° C., 10 seconds, to measure heat resistance cycle, S/D) to measure a pull between copper foil and laminate (peeling strength, half ounce copper foil, P/S), dielectric constant (Dk is the lower the better), dielectric dissipation factor (Df is the lower the better), and flame retardation (flaming test, burning test, UL94, with the ranking: V-0>V-1>V-2).

The results of measurement of the resin composition in embodiments 1-5 are shown in Table 2. The results of measurement of the resin composition in comparisons 1-4 are shown in Table 4.

TABLE 1

| ingredient | | E1 | E2 | E3 | E4 | E5 |
|---|---|---|---|---|---|---|
| epoxy resin | HP-7200HH | 100 | 0 | 100 | 100 | 100 |
| epoxy resin | BE-188 | 0 | 100 | 0 | 0 | 0 |
| 4,4'-oxydialiline | 4,4'-ODA | 9 | 13 | 9 | 8 | 6 |
| amino triazine novolac (ATN) resin | LA-7054 | 5 | 5 | 5 | 5 | 20 |
| dicyandiamide | DICY | 0 | 0 | 0 | 0.5 | 0 |
| flame retardant | SPB-100 | 0 | 0 | 23 | 23 | 21 |
| inorganic filler | fused silica | 35 | 35 | 41 | 41 | 44 |
| catalyst | 2E4MI | 0.2 | 0.15 | 0.2 | 0.2 | 0.1 |
| solvent | MEK | 25 | 68 | 40 | 40 | 35 |

TABLE 2

| property test | method | E1 | E2 | E3 | E4 | E5 |
|---|---|---|---|---|---|---|
| S/D | solder dip, heat resistance cycle | >15 | >15 | >15 | >15 | >15 |
| P/S | Hoz (lb/in) | 6.9 | 7.2 | 6.9 | 6.9 | 6.1 |
| Dk | 2 GHz | 4.25 | 4.29 | 4.25 | 4.23 | 4.32 |
| Df | 2 GHz | 0.0125 | 0.0128 | 0.0125 | 0.0124 | 0.0137 |
| flame retardation | burning test, UL94 | V-1 | V-1 | V-0 | V-0 | V-0 |

The halogen-free resin composition of the present invention in embodiments 1-5 has a low dielectric constant, a low dielectric dissipation factor, high heat resistance, and high flame retardation.

A comparison of embodiment 1 with embodiment 4 reveals that the physical properties and features of the resin composition of the present invention remain unchanged regardless of whether the dicyandiamide (DICY) in embodiment 4 is added thereto, indicating that the resin composition of the present invention is not limited by the joint use of any other curing agent.

TABLE 3

| ingredient | | C1 | C2 | C3 | C4 |
|---|---|---|---|---|---|
| epoxy resin | HP-7200HH | 100 | 100 | 100 | 100 |
| 4,4'-oxydialiline | 4,4'-ODA | 0 | 0 | 16 | 9 |
| diaminodiphenyl sulfone | DDS | 9 | 8 | 0 | 0 |
| amino triazine novolac (ATN) resin | LA-7054 | 5 | 5 | 5 | 25 |
| dicyandiamide | DICY | 0 | 0.5 | 0 | 0 |
| flame retardant | SPB-100 | 0 | 23 | 24 | 22 |
| inorganic filler | fused silica | 35 | 41 | 44 | 47 |
| catalyst | 2E4MI | 0.2 | 0.2 | 0.3 | 0.1 |
| solvent | MEK | 25 | 40 | 43 | 38 |

TABLE 4

| property test | method | C1 | C2 | C3 | C4 |
|---|---|---|---|---|---|
| S/D | solder dip, heat resistance cycle | >15 | >15 | 8 | 2 |
| P/S | Hoz (lb/in) | 6.9 | 6.9 | 7.6 | 5.3 |
| Dk | 2 GHz | 4.35 | 4.33 | 4.31 | 4.38 |
| Df | 2 GHz | 0.0145 | 0.0144 | 0.0126 | 0.0149 |
| flame retardation | burning test, UL94 | v-1 | v-0 | v-0 | v-0 |

A comparison of embodiment 1 with comparisons 1-5 reveals the following: in comparisons 1 and 2, diaminodiphenyl sulfone (DDS) substitutes for oxydianiline (ODA) and thereby causes deterioration of dielectric properties; in comparison 2, although dicyandiamide (DICY) is added, its dielectric properties are still worse than that of the halogen-free resin composition of the present invention; in comparison 3, excessive 4,4'-oxydialiline causes deterioration of laminate heat resistance, copper foil pull, and dielectric properties; and, in comparison 4, excessive amino triazine novolac (ATN) resin causes deterioration of laminate heat resistance, copper foil pull, and dielectric properties.

As described above, the present invention meets the three requirements of patentability, namely novelty, non-obviousness, and industrial applicability. Regarding novelty, and non-obviousness, the halogen-free resin composition of the present invention features specific ingredients, and proportions thereof to attain a low dielectric constant, a low dielectric dissipation factor, high heat resistance, and high flame retardation, and produce a prepreg or a resin film, and is thus applicable to copper clad laminates, and printed circuit boards. Regarding industrial applicability, products derived from the present invention meet market demands fully.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications, and replacements made to the aforesaid embodiments should fall within the scope of the present invention. Accordingly, the legal protection for the present invention should be defined by the appended claims.

What is claimed is:

1. A halogen-free resin composition, comprising:
   (A) 100 parts by weight of dicyclopentadiene epoxy resin;
   (B) 6 to 9 parts by weight of 4,4'-oxydianiline; and
   (C) 5 to 20 parts by weight of amino triazine novolac resin.

2. The halogen-free resin composition of claim 1, further comprising dicyandiamide.

3. The halogen-free resin composition of claim 2, wherein the dicyandiamide is 0.01 to 3 parts by weight.

4. The halogen-free resin composition of claim 1, further comprising 10 to 100 parts by weight of a halogen-free flame retardant.

5. The halogen-free resin composition of claim 4, wherein the halogen-free flame retardant is at least one selected from the group consisting of bisphenol diphenyl phosphate, ammonium poly phosphate, hydroquinone bis-(diphenyl phosphate), bisphenol A bis-(diphenylphosphate), tri(2-carboxyethyl)phosphine, tris(chloroisopropyl)phosphate, trimethyl phosphate, dimethyl methyl phosphonate, resorcinol dixylenylphosphate, phosphazene, m-phenylene methylphosphonate, melamine polyphosphate, melamine cyanurate, tri-hydroxy ethyl isocyanurate, 9,10-dihydro-9-oxa-10-phosphaphenanthrene-10-oxide, DOPO-containing phenol resin, DOPO-containing epoxy resin, and DOPO-HQ epoxy resin.

6. The halogen-free resin composition of claim 1, further comprising at least one selected from the group consisting of an inorganic filler, a curing accelerator, a silane coupling agent, a toughening agent, and a solvent.

7. The halogen-free resin composition of claim 6, further comprising at least one selected from the group consisting of phenol resin, phenol novolac resin, polyphenylene ether resin, cyanate ester resin, isocyanate ester resin, maleimide, polyester resin, styrene resin, butadiene resin, phenoxy resin, polyamide, polyimide, and modified derivatives thereof.

8. A prepreg, comprising the halogen-free resin composition of claim 1.

9. A copper clad laminate, comprising the prepreg of claim 8.

10. A printed circuit board, comprising the copper clad laminate of claim 9.

* * * * *